United States Patent
Marty et al.

(10) Patent No.: US 6,656,812 B1
(45) Date of Patent: Dec. 2, 2003

(54) VERTICAL BIPOLAR TRANSISTOR HAVING LITTLE LOW-FREQUENCY NOISE AND HIGH CURRENT GAIN, AND CORRESPONDING FABRICATION PROCESS

(75) Inventors: Michel Marty, St. Paul de Varces (FR); Didier Dutartre, Grenoble (FR); Alain Chantre, Seyssins (FR); Sébastien Jouan, Grenoble (FR); Pierre Llinares, Crolles (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 09/717,825

(22) Filed: Nov. 21, 2000

(30) Foreign Application Priority Data

Nov. 23, 1999 (FR) ............................................ 99 14746

(51) Int. Cl.[7] .................... H01L 21/331; H01L 21/8222; H01L 21/28; H01L 21/44; H01L 31/11; H01L 27/082; H01L 27/102
(52) U.S. Cl. ...................... 438/343; 438/345; 438/309; 438/583; 438/368; 438/353; 257/593; 257/587; 257/580; 257/581; 257/582; 257/592
(58) Field of Search ................................ 257/593, 587, 257/580, 581, 582, 592; 438/345, 365, 583, 368, 353, 309, 343

(56) References Cited

U.S. PATENT DOCUMENTS

| | | | | |
|---|---|---|---|---|
| 4,789,885 A | * | 12/1988 | Brighton et al. | 148/DIG. 11 |
| 5,101,256 A | * | 3/1992 | Harame et al. | 257/565 |
| 5,162,245 A | * | 11/1992 | Favreau | 148/DIG. 26 |
| 5,668,022 A | | 9/1997 | Cho et al. | 438/320 |
| 5,773,350 A | | 6/1998 | Herbert et al. | 438/364 |
| 5,798,277 A | * | 8/1998 | Ryum et al. | 438/318 |
| 6,362,066 B1 | * | 3/2002 | Ryum et al. | 257/565 |

FOREIGN PATENT DOCUMENTS

| | | | |
|---|---|---|---|
| EP | 0129385 | 12/1984 | H01L/29/72 |
| EP | 0431836 | 6/1991 | H01L/29/08 |
| FR | 2779572 | 12/1999 | H01L/21/331 |

OTHER PUBLICATIONS

Sato et al., *Stoichiometric ECR $SiO_2$ Interlayer for Polysilicon Emitter Bipolar Transistors Using MBE System*, Proceedings of the Bipolar Circuits and Technology Meeting, <(BCTM), US, New York, IEEE, Sep. 17, 1990, pp. 29–32, XP000202446.

* cited by examiner

*Primary Examiner*—Steven Loke
*Assistant Examiner*—Samuel A Gebremariam
(74) *Attorney, Agent, or Firm*—Lisa K. Jorgenson; Allen, Dyer, Doppelt, Milbrath & Gilchrist, P.A.

(57) ABSTRACT

A vertical bipolar transistor includes a semiconductor substrate, an extrinsic collector layer in the semiconductor substrate, an intrinsic collector on the extrinsic collector, a lateral isolating region surrounding an upper part of the intrinsic collector, an offset extrinsic collector well, a base including a semiconductor region above the intrinsic collector and above the lateral isolating region including at least one silicon layer, and a doped emitter surrounded by the base. The doped emitter may include first and second parts. The first part may be formed from single-crystal silicon and in direct contact with the upper surface of the semiconductor region in a predetermined window in the upper surface above the intrinsic collector. The second part may be formed from polycrystalline silicon. The two parts of the emitter may be separated by a separating oxide layer spaced apart from the emitter-base junction of the transistor.

14 Claims, 7 Drawing Sheets

VERTICAL BIPOLAR TRANSISTOR HAVING LITTLE LOW-FREQUENCY NOISE AND HIGH CURRENT GAIN, AND CORRESPONDING FABRICATION PROCESS

FIELD OF THE INVENTION

The invention relates to vertical bipolar transistors, especially those integrated in high-frequency and very large-scale integration (VLSI) technologies. More particularly, the invention relates to the characteristics and the production of the emitters of such transistors.

BACKGROUND OF THE INVENTION

In bipolar technologies using a polysilicon emitter, the emitter is formed by depositing polysilicon (which may be carried out in a conventional oven) followed by doping. Alternatively, the emitter may be doped in situ in a chemical vapor deposition (CVD) reactor. In both cases, an oxide layer is present at the emitter/base interface. This layer limits the hole current in the base as the injected electrons continue to flow because of the tunnel effect. This contributes to achieving a sufficient current gain (Ic/Ib).

However, such transistors with a polysilicon emitter exhibit low-frequency noise manifested in low-frequency fluctuations in the transistor current. This is particularly problematic in the case of radio frequency (RF) circuits which incorporate such transistors for separating two close carriers. This may also be problematic in the case of oscillators.

SUMMARY OF THE INVENTION

An object of the invention is to provide a vertical bipolar transistor having reduced low-frequency noise while at the same time having acceptable static parameters and a correct current gain.

According to the invention, a process for fabricating a vertical bipolar transistor includes producing an intrinsic collector, for example by epitaxy or implantation, on an extrinsic collector layer buried in a semiconductor substrate. The method also includes producing a lateral isolating region surrounding the upper part of the intrinsic collector and of an offset extrinsic collector well. Moreover, a base (e.g., a completely silicon base or preferably a base with an silicon-germanium (SiGe) heterojunction) is produced above the intrinsic collector and above the lateral isolating region.

The base may be formed by non-selective epitaxy of a semiconductor region and include at least one silicon layer (in the case of a completely silicon base). Furthermore, the method may include producing an in-situ doped emitter, which includes first and second substeps. The first substep includes producing a first emitter part from single-crystal silicon and in direct contact with a part ("emitter window") of the upper surface of the semiconductor region above the intrinsic collector. The second substep includes producing a second emitter part from polycrystalline silicon and separated from the single-crystal-silicon first emitter part by a separating oxide layer.

In other words, the emitter of the transistor according to the invention includes of two parts. A first part (i.e., a bottom part), which is close to the emitter-base junction is grown epitaxially. This makes it possible to move the oxide interface away from the junction, and is advantageous because the oxide interface is a source of low-frequency noise. Next, after having produced an oxide interface on the epitaxially grown single-crystal part, the emitter is produced from in-situ doped polysilicon. Thus, it is possible to maintain high static characteristics and a high current gain.

According to one method of implementing the invention compatible with a SiGe base, the step of producing the base includes non-selective epitaxy of a multilayer forming the semiconductor region. The multilayer may include, apart from the silicon layer, at least one silicon-germanium layer, e.g., a SiGe layer encapsulated by two silicon layers or a SiGe layer on a silicon layer. Moreover, the first substep of producing the emitter may include epitaxially growing silicon on a predetermined window ("emitter window") in the surface of the multilayer above the intrinsic collector to provide, above the window, the first part of the emitter region. The first part of the emitter region is formed from single-crystal silicon and in direct contact with the upper layer of the multilayer. Regarding the second substep, a separating oxide layer may be advantageously deposited on the first part of the emitter region, and polycrystalline silicon may be deposited on the separating oxide layer.

As indicated above, the production of a single-crystal partially epitaxially-grown emitter directly on the base (note that the emitter-base junction defining the upper part of the intrinsic base in fact lies in the upper encapsulation layer) results in there being no interface oxide near the emitter-base junction. As such, this leads to an appreciable reduction in the low-frequency noise. Furthermore, the presence of a base having a silicon-germanium heterojunction also contributes to an acceptable current gain because of the lowering of the potential barrier. The combination of a SiGe base and a emitter is therefore particularly advantageous from the current/gain standpoint.

The first substep of producing the emitter (i.e., the single-crystal part) may include first and second phases. The first phase may include depositing a first layer of silicon dioxide on the surface of the multilayer and depositing a second layer of silicon nitride on the first layer. The first substep may further include etching through the second layer to the first layer in a zone corresponding to the location of the emitter window. The zone may then be chemically deoxidized to provide in the window a silicon surface having an oxygen atom concentration of less than $10^{15}$ atoms/cm$^2$.

The second phase of the first substep may include exposing the semiconductor block provided in the first phase to a silane/dopants gas mixture in a non-oxidizing controlled atmosphere. This may be done, for example, under vacuum in an ultra-clean chemical vapor deposition (CVD) reactor well known to those skilled in the art.

Thus, the invention makes it possible to use conventional conditions for depositing polysilicon in an ultra-clean CVD reactor. However, the silicon grows as a single crystal on the base because of the chemically clean nature of the window in the base. On the other hand, the use of conventional conditions for depositing polysilicon makes it possible in the second substep (i.e., the top part of the emitter) to obtain polycrystalline silicon because of the presence of the separating oxide layer.

After the second substep, a polycrystalline silicon layer is provided which may be etched to form an emitter having an upper region wider than the emitter window and extending on part of the silicon nitride layer. Isolating spacers in contact with the vertical walls of the wider upper region of the emitter may then be formed.

The first phase of the first substep may include depositing a thick third layer of silicon dioxide on the second layer of silicon nitride and preliminarily etching into the silicon dioxide third layer to the second layer in a region corresponding to the position of the zone. The region consequently corresponds to the emitter window. Thus, after the first phase, a semiconductor block is obtained which includes a multilayer of the three isolating layers defining a cavity of the same width as the emitter window.

After the second phase (i.e., after epitaxy of the emitter) and after the second substep, the cavity may be filled with the single-crystal silicon with the separating oxide layer thereon and the polycrystalline silicon on the separating oxide layer. The third layer of silicon dioxide is then etched on either side of the emitter block formed in the cavity, and isolating spacers in contact with the vertical walls of the emitter are formed.

In other words, according to this embodiment of the invention, a smaller distance is obtained between the edge of the emitter and the implanted zone of the extrinsic base. This helps to further decrease the base resistance as well as the base-collector capacitance. Furthermore, this reduced distance is controlled by a single level of photolithography.

According to another embodiment of the invention, a vertical bipolar transistor includes an intrinsic collector on an extrinsic collector layer buried in a semiconductor substrate, a lateral isolating region surrounding the upper part of the intrinsic collector, an offset extrinsic collector well, and a base. The base may include a semiconductor region located above the intrinsic collector and above the lateral isolating region and including at least one silicon layer. The transistor may also include a doped emitter, surrounded by the base, having a first part formed from single-crystal silicon and in direct contact with the upper surface of the semiconductor region in a predetermined window (emitter window) in the upper surface located above the intrinsic collector. The emitter may also have a second part formed from polycrystalline silicon. The two parts of the emitter may be separated by a separating oxide layer located some distance from the emitter-base junction of the transistor.

The window in the upper surface of the semiconductor region may advantageously have an oxygen atom concentration of less than about $10^{15}$ atoms/cm$^2$, for example. The height of the first (single-crystal) part of the emitter may be between a few nanometres and a few tens of nanometres. If the base is a base having a silicon-germanium heterojunction, for example, the semiconductor region may be advantageously formed from a multilayer comprising at least one silicon layer and at least one SiGe layer.

BRIEF DESCRIPTION OF THE DRAWINGS

Further advantages and characteristics of the invention will appear up examination of the detailed description of the methods of implementation and embodiments of the present invention, given by way of non-limitative example, and the appended drawings, in which.

DETAILED DESCRIPTION OF THE PREFERRED EMBODIMENTS

Figure 1:
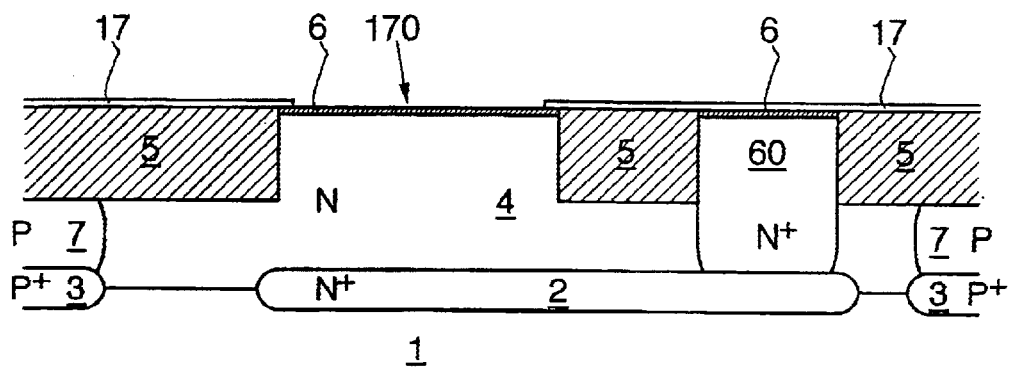
FIGS. 1 to 7 illustrate diagrammatically a first method of implementing the process according to the invention, resulting in a first embodiment of a bipolar transistor according to the invention.

Turning now to FIG. 1 a silicon substrate 1, (e.g., p-type) on the surface of which an n$^+$-doped buried extrinsic collector layer 2 is conventionally produced in a manner known in the art. For example, the extrinsic collector 2 may be formed by arsenic implantation. Likewise, two p$^+$-doped buried layers 3 are conventionally produced, on either side of the extrinsic collector 2, by boron implantation, for example. Thick epitaxy is carried out on the substrate 1, which is known per se, to produce an n-type single-crystal silicon layer 4 typically having a thickness of the order of about 1 micron.

A lateral isolating region 5 is produced, again in a known manner, in layer 4 either by a localized oxidation (LOCOS) process or by a shallow trench process. For simplicity, a lateral isolating region 5 of the shallow-trench type has been shown in FIG. 1. An n$^+$-doped collector well 60 contacting the buried layer 2 is also conventionally produced, e.g., by phosphorus implantation. Next, boron implantations are performed to produce p-doped wells 7 beneath the lateral isolating region 5. This allows isolation with respect to the transistors adjacent to the bipolar transistor described herein.

A thermal oxide (e.g., silicon dioxide) is conventionally grown on the surface of the epitaxially grown single-crystal intrinsic collector 4. This silicon dioxide growth is also produced over the entire wafer, and especially over the collector well 60. This oxide also forms the gate oxide for insulated-gate field-effect complementary transistors (CMOS transistors) produced in conjunction with the bipolar transistor on the same wafer (BiCMOS or bipolar CMOS technology).

An amorphous silicon layer 17 having a thickness of about 500Å is deposited on the semiconductor block. Next, a window 170, or "base window," is etched by plasma etching which stops on the oxide layer 6. The two parts of the etched silicon layer 17 may or may not overhang the intrinsic collector 4 slightly.

Figure 2:
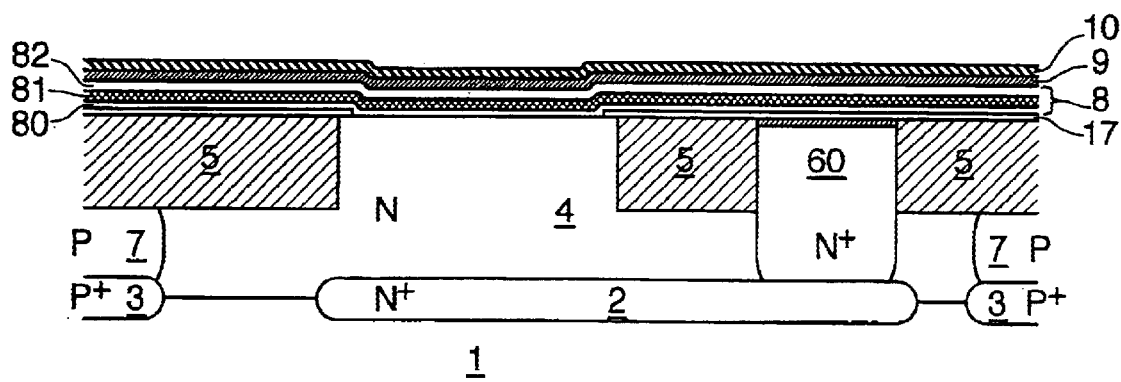

As shown in FIG. 2, the oxide layer 6 located above the collector undergoes chemical deoxidation. It should be noted here that one of the functions of the amorphous silicon layer 17 is to protect the rest of the wafer during this chemical deoxidation, especially the lateral isolating zones when they are produced by shallow trenches.

After a treatment in which the base window undergoes desorption in hydrogen at a temperature above about 600° C., a multilayer 8 including three layers 80, 81 and 82 is grown by epitaxy, within which the future base of the transistor will be produced. More specifically, an undoped silicon first layer 80 is grown by epitaxy over a thickness of a few tens of nanometres. The second layer 81, formed from silicon-germanium, is then grown epitaxially. It in fact includes a Si$_{1-x}$Ge$_x$ first sublayer, where x is constant and between about 0.1 and 0.2, over which a second sublayer is formed from an Si$_{1-x}$Ge$_e$ alloy (where x decreases down to 0, for example) and p-doped by boron. The total thickness of the layer 81 may typically be about 10 to 100 nm, for example.

A layer 82 of silicon p-doped with boron is then formed on the second sublayer of the layer 81. The layer 82 is grown epitaxially to a thickness of a few tens of nanometres. This epitaxy may be carried out in an ultra-clean CVD deposition reactor at about 700° C., for example. A multilayer including single-crystal layers is thereby provided on the intrinsic collector in the base window and polycrystalline layers above the amorphous silicon layers 17. This multilayer will allow a base with a silicon-germanium heterojunction to be formed. It should be noted here that the epitaxy for producing the base with a heterojunction may be non-selective epitaxy, for example.

Moreover, the presence of the amorphous silicon layer 17 allows a surface formed substantially from silicon to be presented at the start of epitaxy. This makes it possible to obtain substantially identical growth rates on the intrinsic connector and on the amorphous silicon, resulting in better thickness homogeneity of the base. A silicon dioxide first layer 9 is then deposited with a thickness of about 200Å on the layer 82. Deposited on the silicon dioxide first layer 9 is a silicon nitride ($Si_3N_4$) second layer 10 with a thickness of 300Å.

Figure 3:
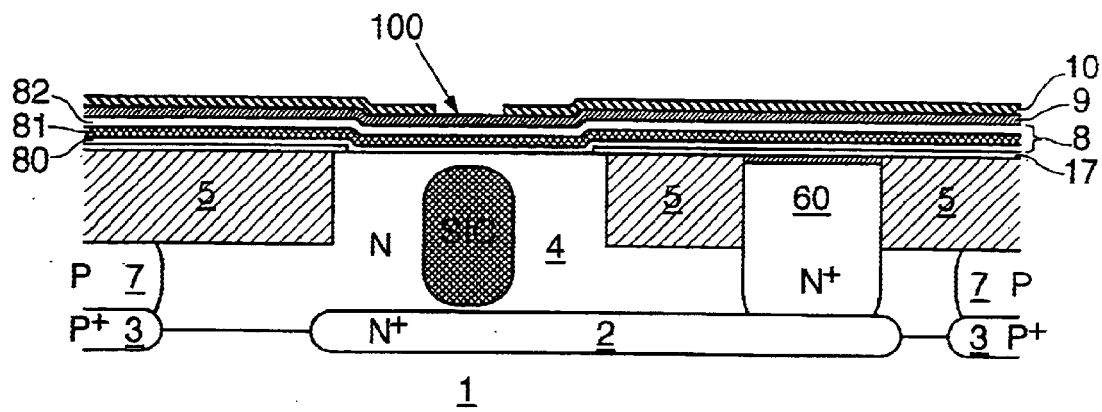

As shown in FIG. 3, a zone 100 is defined using a mask in the nitride layer 10 corresponding to an emitter window located above the intrinsic collector 4. The nitride layer 10 is thus conventionally plasma-etched using a resin layer corresponding to the mask where the etching stops on the silicon dioxide layer 9, revealing the zone 100. Next, while keeping the resin present on the layer 10 and having made use of the etching of the latter, phosphorus is implanted through the base. Selective overdoping of the collector (i.e., selective implantation of the collector) below the window of the emitter may be carried out in one or more implantation steps. This helps to increase the speed of the transistor while decreasing the resistance of the collector. An overdoped SIC zone is therefore provided below the emitter window.

Figure 4:
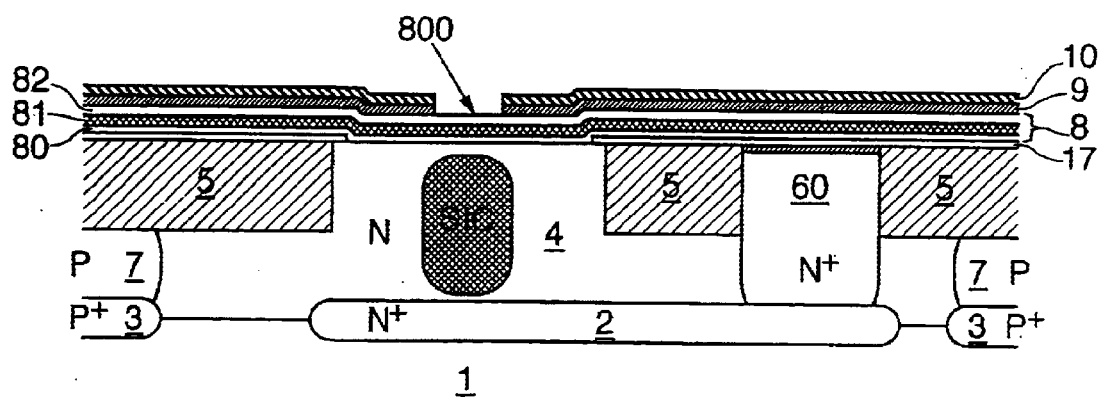

After this step, the resin present on the silicon nitride layer 10 is removed and a chemical deoxidation treatment is carried out to remove that part of the silicon dioxide layer 9 located in the zone 100 and thus to produce the emitter window 800 (FIG. 4). An example of such a chemical deoxidation treatment includes using, for about 1 minute, an acid bath based on hydrofluoric acid diluted to about 1%. This makes it possible to obtain a chemically clean single-crystal silicon surface, i.e. one of which the oxygen atom concentration is less than about $10^{15}/cm^2$. Moreover, such a chemical deoxidation does not degrade the surface of subjacent single-crystal silicon (unlike a plasma-etching operation, for example) and consequently does not introduce crystal defects.

To further improve the surface state of the silicon, a high-temperature (e.g., greater than 550° C.) desorption treatment in hydrogen is performed to remove residual impurities adsorbed on the surface of the silicon during the deoxidation. The first part of the emitter of the transistor is produced in an ultra-clean CVD deposition reactor. The Centura HTF CVD deposition reactor from Applied Materials is one example of such a reactor.

More specifically, the semiconductor block with the uncovered base in the emitter window 800 is exposed to a silane/arsine gas mixture in a non-oxidizing atmosphere, typically in a vacuum, or in hydrogen. The CVD deposition conditions are, for example, a hydrogen flow rate of 10 liters/minute, a silane flow rate of 0.5 liters/minute, and an arsine flow rate of 0.12 $cm^3$/minute, at 630° C. and at a pressure of 80 torr.

Those skilled in the art will note that these conditions correspond to polysilicon deposition. However, because of the chemically clean nature of the single-crystal surface of the exposed base in the window 800, the silicon deposited in this reactor grows epitaxially, i.e., as a single crystal on the base. On the other hand, in contact with the sidewalls of the layers 9 and 10 and of the upper surface of the layer 10, the silicon deposited is polycrystalline.

Figure 5:
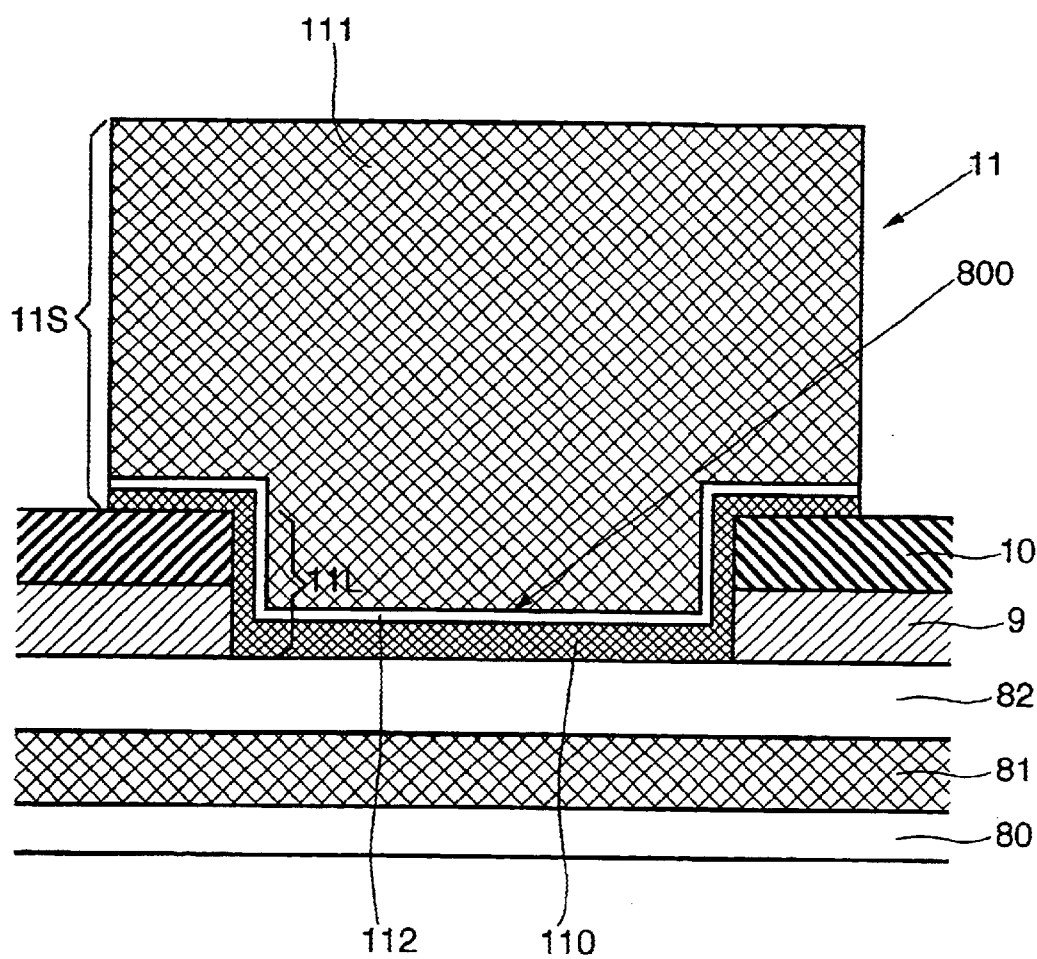

Thus, a single-crystal silicon layer 110 is provided in the part in contact with the silicon of the base and a polycrystalline layer along the sidewalls of the layers 9 and 10 and on the surface of the layer 10 (FIG. 5). The layer 110 has a thickness of between about a few nanometers and a few tens of nanometers, e.g., between about 4 nanometers and approximately 20 nanometers, and, more specifically about 8 nanometers.

Using conventional methods, such as an oxidizing step to clean the layer 110, a separating silicon oxide layer 112 having a thickness of less than 1 nanometer, for example, is provided. A polycrystalline silicon layer 111 is then deposited while maintaining the same deposition conditions as those used for obtaining the first part 110 of the emitter. This layer 111 may also be deposited in a conventional polysilicon deposition furnace. In such case, the interfacial oxide 112 forms naturally on entering the furnace.

The process then conventionally uses a new photolithography mask, as well as a corresponding block of resin, to etch the polycrystalline silicon layer to obtain an emitter 11 (FIG. 5). The emitter 11 has a first part 110 formed from single-crystal silicon, having a separating oxide layer 112 thereon, which in turn has a second part 111 thereon formed from polycrystalline silicon. The total height of the emitter may be between 150 nanometers and 250 nanometers, for example.

This emitter, which has been doped in situ, is therefore single-crystal near the interface with the base in the emitter window. It is polycrystalline above the separating oxide layer. Consequently, the separating oxide layer lies a greater distance from the emitter-base junction than in transistors having a conventional polycrystalline emitter. This makes it possible to reduce the low-frequency noise while still maintaining the high static and dynamic characteristics of transistors having polycrystalline emitters.

Moreover, in this embodiment of the invention, the upper part 11S of the emitter is wider than the lower part 11L of the emitter, which lies in the emitter window. The distance between the edge of the emitter window and the edge of the upper region 11S may be about 0.2 $\mu$m. Next, a silicon nitride layer is deposited and etched to provide spacers 120, which include the silicon nitride layer 10 and are adjacent the vertical walls of the upper region of the emitter and on the silicon dioxide layer 9.

Figure 6:
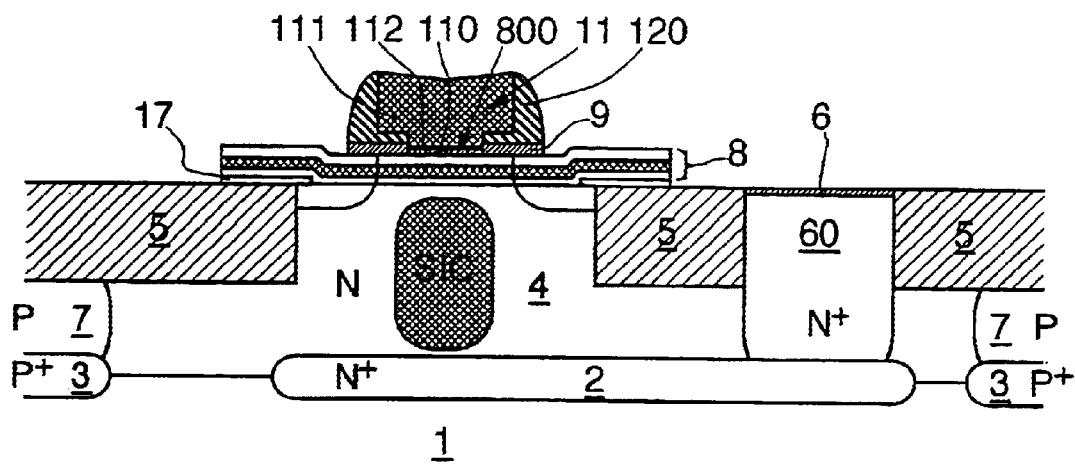

A resin vignette is deposited above the emitter, and the multilayer 8 undergoes $p^+$ implantation using boron to define the extrinsic base Be. Next, the geometry of the transistor base is defined using a new mask and, after the oxide layer 9 has been pre-etched, the multilayer including the layers 17 and 8 is etched to obtain the configuration illustrated in FIG. 6. After having protected the transistor with resin, arsenic is implanted to produce an $n^+$-implanted zone 600 on the surface of the collector well.

A final step includes producing the base-emitter and base-collector connection pads S using a known self-aligned silicide technique. This technique includes the deposition of a metal (e.g., titanium) layer in order to form a silicide ($TiSi_2$) on the silicon zones of the extrinsic base, of the emitter, and of the extrinsic collector.

Figure 7:
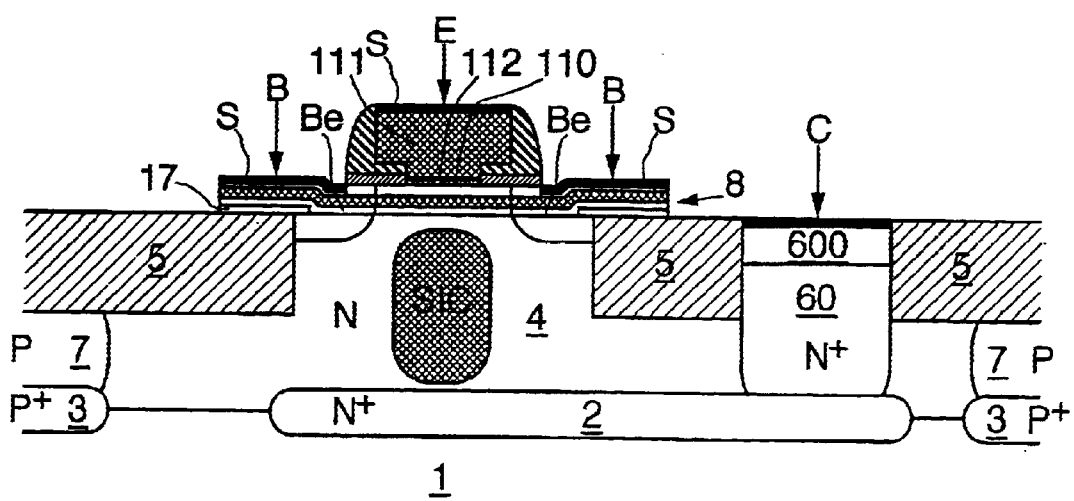

The transistor according to the invention, as illustrated in FIG. 7, is therefore an n-p-n vertical bipolar transistor based on a silicon-germanium heterojunction which may be used in a BiCMOS technology of the VLSI type. It includes an emitter having a first part formed from single-crystal silicon in direct contact with the silicon of the upper encapsulation layer 82. However, because of the dopant diffusions and various conventional heat treatments, the emitter-base junction lies within the layer 82. The separating oxide layer 112 lies a certain distance from the emitter-base junction. The transistor has a reduced low-frequency noise, while retaining good static parameters, especially current gain. It furthermore has an emitter resistance which is smaller than in transistors having a conventional polycrystalline emitter. It should be noted that, for the sake of simplifying the drawings, only the lower straight parts of the layers 110 and 112 have been shown in FIGS. 6 and 7.

In the embodiment that has just been described, the distance between the edge of the window 800 and the edge of the upper region 11S of the emitter depends on the alignment of the photolithography mask used for etching the upper region of the emitter with respect to the photolithography mask used for etching the emitter window proper. This makes the fabrication of the transistor a bit more difficult.

Figure 8:
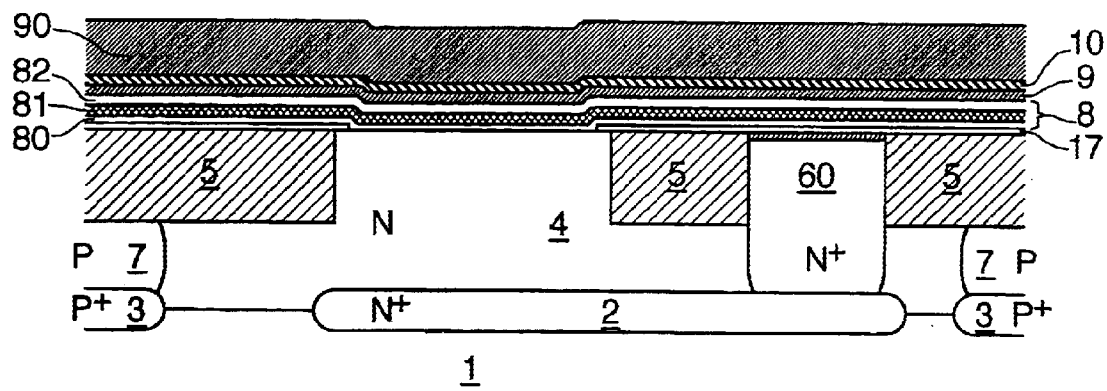
FIGS. 8 to 13 illustrate diagrammatically a second method of implementing the process according to the invention, resulting in a second embodiment of a bipolar transistor according to the invention.
Figure 9:
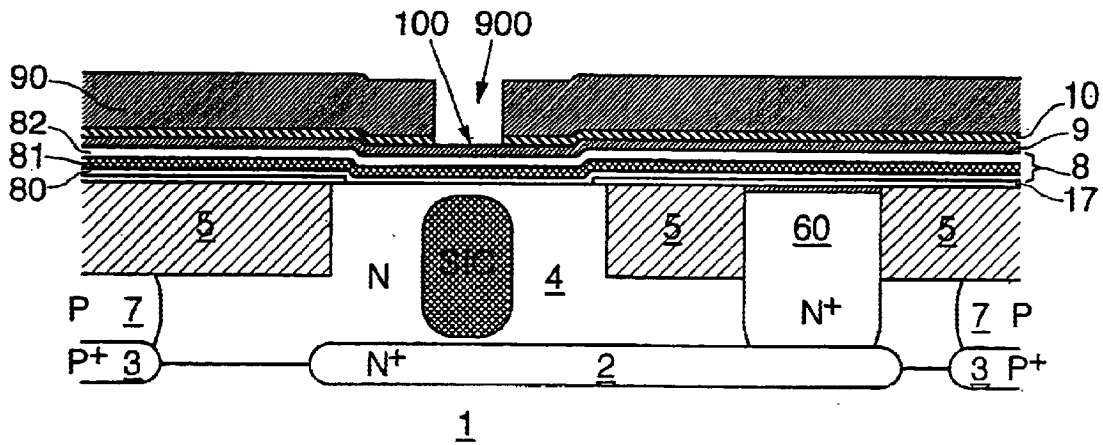
Figure 10:
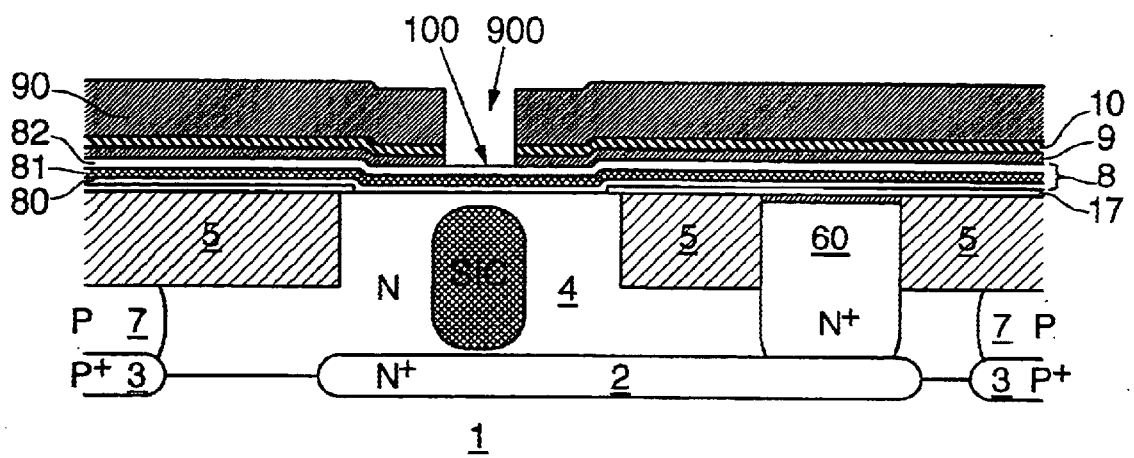

The embodiment illustrated in FIGS. 8 through 13 allows this problem to be overcome. This is because, as illustrated in FIG. 8, a thick, silicon dioxide third layer 90 (i.e., having a thickness of 2000Å, for example) is deposited on the silicon nitride layer 10. The thick layer 90 is conventionally plasma-etched (FIG. 9) to the silicon nitride second layer 10 in a region 900 corresponding to the position of the zone 100 in the layer 10 (FIG. 3), and consequently the position of the emitter window 800. The etching of the emitter window continues (FIG. 10) in a manner similar to that described in the previous embodiment. Likewise, the implantation of the SIC zone is similar to that described above.

Again, as described above, silicon is deposited under polysilicon deposition conditions causing the re-epitaxy of silicon 110 on the base in the cavity left within the multilayer including the successive layers of silicon dioxide 9, silicon nitride 10 and silicon dioxide 90. This single-crystal silicon deposition is followed, in a manner similar to that described above, by the formation of the separating oxide layer 112 and a deposition of polycrystalline silicon.

Figure 11:
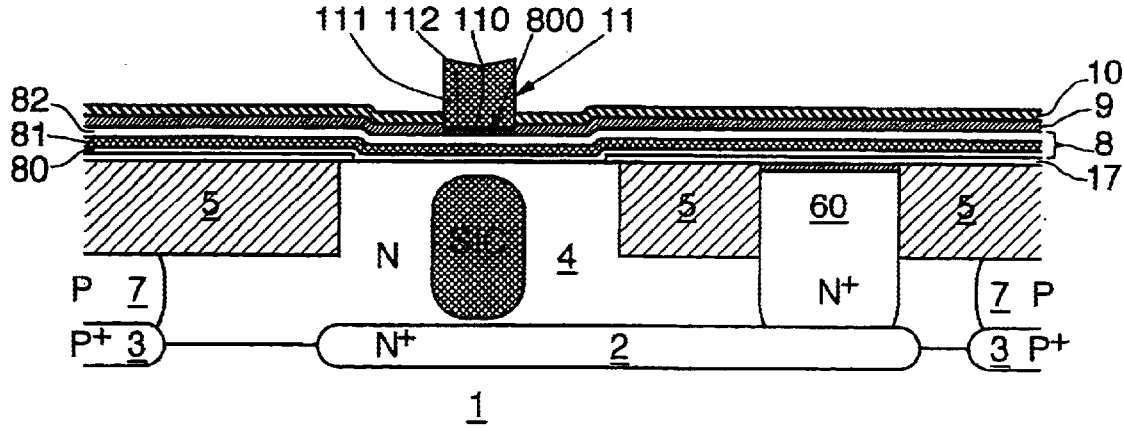
Figure 12:
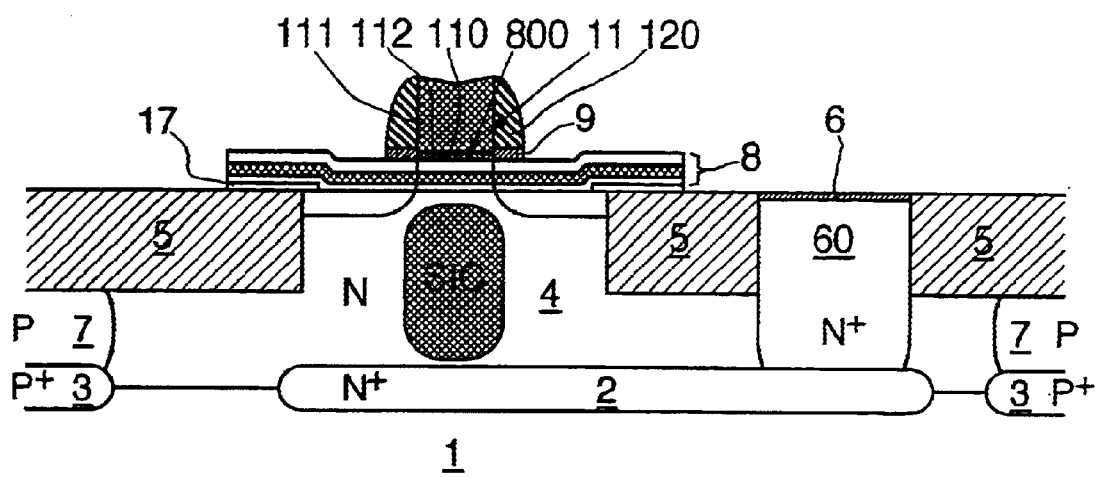
Figure 13:
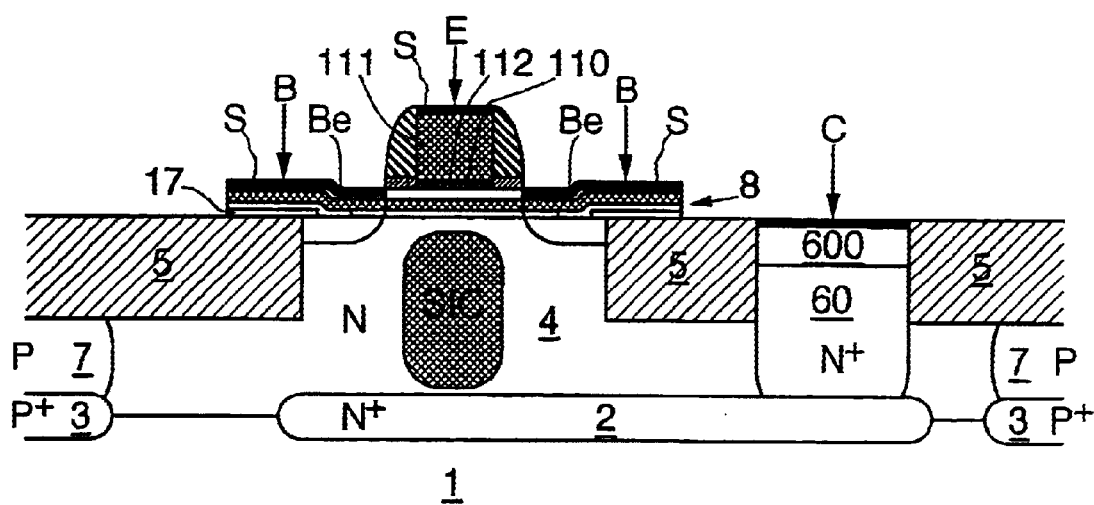

The polycrystalline silicon hanging over the cavity is removed, for example, by chemical-mechanical polishing or by whole-wafer etching which stops on the oxide layer 90. As shown in FIG. 11, the layer 90 on either side of the polycrystalline silicon 111 is plasma-etched to the silicon nitride layer 10 to provide an emitter formed from a single block having the same width as the emitter window. Here again, for the sake of simplifying the drawings, only the lower straight parts of the layers 110 and 112 have been shown in FIG. 11 and the following figures.

The following steps in this method, particularly the formation of the spacers 120, are similar to those described above (FIGS. 12 and 13). Consequently, a short distance is obtained between the edge of the emitter and the edge of the spacers 120, which distance is no longer controlled by a photolithography operation. Apart from the technological simplification, a lower base resistance and a lower basecollector capacitance are obtained for the transistor illustrated in FIG. 13.

That which is claimed is:

1. A method of fabricating a bipolar transistor comprising:
   forming an intrinsic collector on an extrinsic collector layer in a semiconductor substrate;
   forming a lateral isolating region adjacent an upper part of the intrinsic collector;
   forming a base on the upper part of the intrinsic collector and on the lateral isolating region; and
   forming an emitter by
      forming a first emitter part comprising single-crystal silicon in contact with portions of the base,
      forming a separating oxide layer on the first emitter part, and
      forming a second emitter part comprising polycrystalline silicon on the separating oxide layer so that the separating oxide layer completely separates the second emitter part from the first emitter part.

2. The method according to claim 1 further comprising forming an offset extrinsic collector well on the extrinsic collector and spaced apart from the upper part of the intrinsic collector; and wherein the lateral isolating region surrounds the offset extrinsic collector well.

3. The method according to claim 1 wherein forming the base further comprises growing at least one silicon layer using non-selective epitaxy.

4. The method according to claim 3 wherein forming the base comprises forming at least one SiGe layer on the at least one silicon layer and forming an upper silicon layer on the SiGe layer.

5. The method according to claim 4 wherein forming the first emitter part comprises epitaxially growing the first emitter part in a window on the base corresponding to the intrinsic collector so that the first emitter part contacts the upper layer.

6. The method according to claim 5 wherein forming the emitter comprises:
   depositing a first layer comprising silicon dioxide on the base;
   depositing a second layer comprising silicon nitride on the first layer;
   etching through the second layer to the first layer in a zone corresponding to the window; and
   chemically deoxidizing the zone to form the first emitter part in the window and having an oxygen atom concentration of less than about $10^{15}$ atoms/cm$^2$.

7. The method according to claim 6 wherein forming the emitter further comprises:
   forming the second emitter part by exposing the first and second layers to a gas mixture comprising silane and at least one dopant in a non-oxidizing controlled atmosphere;
   etching the second emitter part to provide an upper region thereof wider than the window and on portions of the silicon nitride layer; and
   forming isolating spacers in contact with vertical walls of the upper region of the emitter.

8. The method according to claim 6 wherein forming the emitter comprises:
   depositing a third layer comprising silicon dioxide on the second layer;
   etching through the third layer to the second layer in a region corresponding to the zone to provide a cavity of a substantially same width as the window;
   forming the separating oxide layer and the second emitter part in the cavity;
   etching the third layer on either side of the first emitter part; and
   forming isolating spacers in contact with vertical walls of the emitter.

9. A method of fabricating a vertical bipolar transistor comprising:
   forming an intrinsic collector on an extrinsic collector layer in a semiconductor substrate;
   forming an offset extrinsic collector well on said extrinsic collector and spaced apart from an upper part of the intrinsic collector;
   forming a lateral isolating region surrounding an upper part of the intrinsic collector and also surrounding the offset extrinsic collector well;

forming a base on the upper part of the intrinsic collector and on the lateral isolating region by growing at least one silicon layer using non-selective epitaxy; and forming an in-situ doped emitter by forming a first emitter part comprising single-crystal silicon in contact with portions of the base, forming a separating oxide layer on the first emitter part and spaced apart from an emitter-base junction of the vertical bipolar transistor, and forming a second emitter part comprising polycrystalline silicon on the separating oxide layer so that the separating oxide layer completely separates the second emitter part from the first emitter part.

10. The method according to claim 9 wherein forming the base comprises forming at least one SiGe layer on the at least one silicon layer and forming an upper layer on the SiGe layer comprising silicon.

11. The method according to claim 10 wherein forming the first emitter part comprises epitaxially growing the first emitter part in a window on the base corresponding to the intrinsic collector so that the first emitter part contacts the upper layer.

12. The method according to claim 11 wherein forming the emitter comprises:

depositing a first layer comprising silicon dioxide on the base;

depositing a second layer comprising silicon nitride on the first layer;

etching through the second layer to the first layer in a zone corresponding to the window; and chemically deoxidizing the zone to form the first emitter part in the window and having an oxygen atom concentration of less than about $10^{15}$ atoms/cm$^2$.

13. The method according to claim 12 wherein forming the emitter further comprises:

forming the second emitter part by exposing the first and second layers to a gas mixture comprising silane and at least one dopant in a non-oxidizing controlled atmosphere;

etching the second emitter part to provide an upper region thereof wider than the window and on portions of the silicon nitride layer; and forming isolating spacers in contact with vertical walls of the upper region of the emitter.

14. The method according to claim 12 wherein forming the emitter comprises:

depositing a third layer comprising silicon dioxide on the second layer;

etching through the third layer to the second layer in a region corresponding to the zone to provide a cavity of a substantially same width as the window;

forming the separating oxide layer and the second emitter part in the cavity;

etching the third layer on either side of the first emitter part; and forming isolating spacers in contact with vertical walls of the emitter.

* * * * *